(12) United States Patent
Quinones et al.

(10) Patent No.: US 7,893,548 B2
(45) Date of Patent: Feb. 22, 2011

(54) SIP SUBSTRATE

(75) Inventors: Maria Clemens Y. Quinones, Cebu (PH); Ruben P. Madrid, Lapu-lapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 285 days.

(21) Appl. No.: 12/053,707

(22) Filed: Mar. 24, 2008

(65) Prior Publication Data

US 2009/0236702 A1    Sep. 24, 2009

(51) Int. Cl.
*H01L 23/28* (2006.01)
(52) U.S. Cl. .............................. 257/787; 257/E23.031
(58) Field of Classification Search ................. 257/787, 257/666, 700, 698, 779–784, E23.031
See application file for complete search history.

(56) References Cited

U.S. PATENT DOCUMENTS

| | | | |
|---|---|---|---|
| 5,932,891 A | 8/1999 | Higashi et al. | |
| 7,061,077 B2 | 6/2006 | Joshi | |
| 7,141,874 B2 * | 11/2006 | Nakatani | 257/700 |
| 7,309,913 B2 | 12/2007 | Shim et al. | |
| 2006/0226534 A1 | 10/2006 | Liang et al. | |
| 2008/0290497 A1 * | 11/2008 | Sugaya et al. | 257/700 |

FOREIGN PATENT DOCUMENTS

JP      05 59847 U      8/1993

OTHER PUBLICATIONS

International Search Report and Written Opinion of corresponding PCT application (PCT/US2009/036452 filed Mar. 9, 2009) completed Aug. 31, 2009 (total 6 pages).

\* cited by examiner

*Primary Examiner*—Davienne Monbleau
*Assistant Examiner*—Hoa B Trinh
(74) *Attorney, Agent, or Firm*—Thomas R. FitzGerald, Esq.; Peter J. Mikesell; Hiscock & Barclay, LLP (57) ABSTRACT

Disclosed in this specification is a system-in-a-package substrate that includes an interconnect substrate for permitting finely pitched connections to be made to an integrated circuit. The interconnect substrate includes a central region on its upper surface for receiving the integrated circuit. The interconnect substrate also has interconnections that electrically connect the finely pitched contacts on the upper surface to larger pitched contacts on the lower surface. The larger pitched contacts connect to a conductive trace frame. The resulting assembly is encased in a molding compound along with a plurality of other devices which are configured to interact with one other through the conductive trace.

12 Claims, 12 Drawing Sheets

SIP SUBSTRATE

FIELD OF THE INVENTION

This invention relates, in one embodiment, to a system in package (SiP) substrate. The package includes an interconnect substrate disposed between a conductive trace frame and an integrated circuit. The interconnect substrate permits the integrated circuit to make electrical contacts with the fine pitch spacing found in the substrate.

BACKGROUND OF THE INVENTION

Current design trends in the computer industry include increased miniaturization of computer components and, as a result, more efficient utilization of circuit board "real estate." One approach to efficiently utilizing space includes the use of system-in-a-package (SiP) substrates, wherein a plurality of integrated circuits are encased within a single package. With the proper configuration, this can reduce the footprint of the package. See U.S. Pat. No. 7,061,077 to Joshi (Substrate Based Unmolded Package Including Lead Frame Structure and Semiconductor Die) and U.S. Pat. No. 7,309,913 to Shim et al. (Stacked Semiconductor Packages).

When a package contains a large number of devices, the device must connect to a large number of leads. The pitch spacing between the leads must be relatively small. Unfortunately, the space limitations imposed by such fine pitch spacing are problematic. Traditional lead frames must be relatively rigid structures in order to maintain their required self-supporting characteristics. If the pitch spacing between the leads of a lead frame is reduced to fit more leads within a given area, the leads necessarily become smaller and their rigidity is unacceptably reduced. Traditional lead frames have proven incapable of providing a large number of fine pitched leads. An alternative solution is desired.

Therefore, a system for producing a package of systems is desired that allows fine pitch leads to be used.

SUMMARY OF THE INVENTION

The invention relates generally to a package and more particularly to a system of devices within a single package. The package includes a interconnect substrate with a plurality of conductive interconnects. The interconnects are configured to permit electrical connections to be made between connectors with relatively fine pitch spacing to connectors with relatively large pitch spacing.

The die is bonded electrically with a composite material in such a manner that the intricate pattern requirement of the integrated circuit wirebonding corresponds to traced connections rerouted within the bulk of the composite material toward the underside of the die. These rerouted trace pads of the composite material are bonded directly to the arrayed pads at a first side of the premolded leadframe substrate.

BRIEF DESCRIPTION OF THE DRAWINGS

The present invention is disclosed with reference to the accompanying drawings, wherein.

Corresponding reference characters indicate corresponding parts throughout the several views. The examples set out herein illustrate several embodiments of the invention but should not be construed as limiting the scope of the invention in any manner.

DETAILED DESCRIPTION OF A PREFERRED EMBODIMENT

Figure 1A:
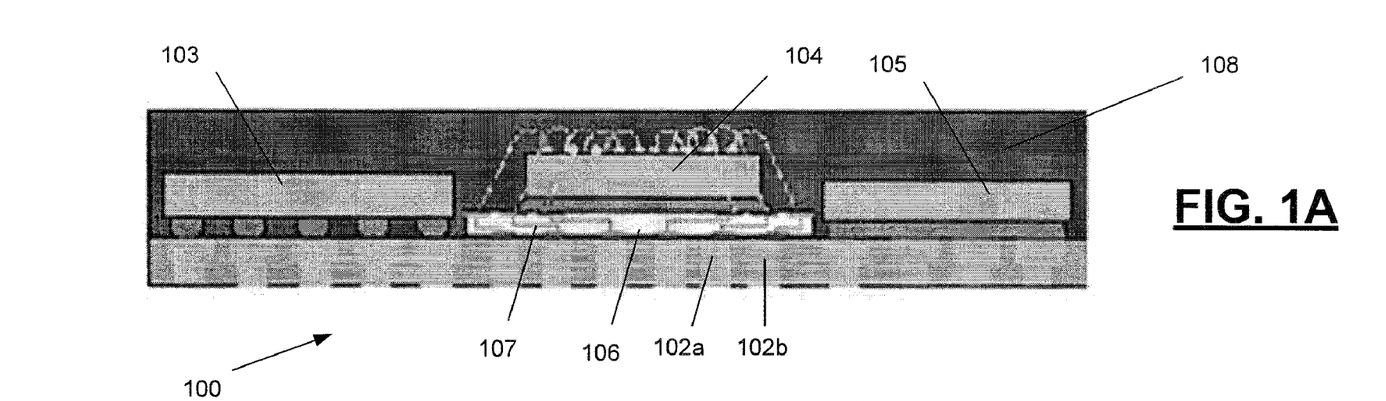
FIG. 1A is a profile view of one embodiment of the invention and FIG. 1B is a perspective cut-away view of the embodiment of FIG. 1A.
Figure 1B:
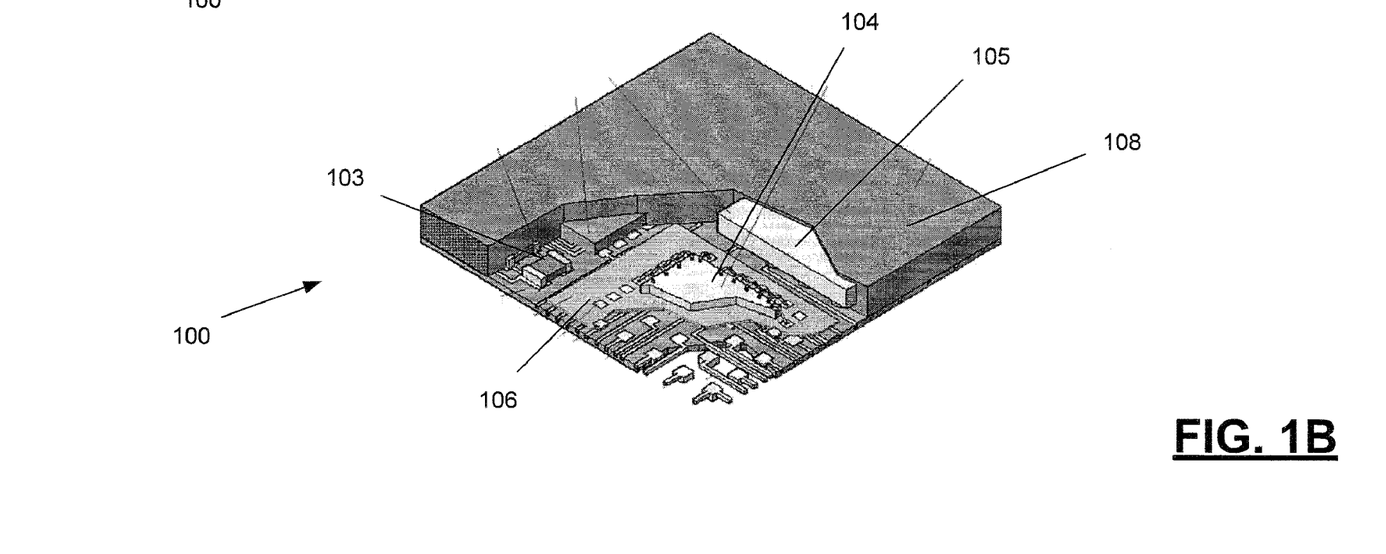

Referring to FIG. 1A, package 100 includes conductive traces 102a and 102b, integrated circuit 104, active or passives devices 103 and 105, interconnect substrate 106, and molding compound 108. FIG. 1B is a cut-out perspective view of package 100 of FIG. 1A. Interconnect substrate 106 has electrical interconnects 107 which are embedded in the interconnect substrate and extend from the upper contacts to the lower contacts. The contacts on the upper surface of the interconnect substrate are electrically connected to device 104. The contacts on the lower surface of the interconnect substrate are electrically connected to traces, 102a and 102b. Interconnect substrate 106 may be a small batch of BT (Bismaleimide Triazine) or FR4 (flame retardant 4) laminate/flex or equivalent composite material. The electrical interconnects 107 are rerouted to fully utilize the space underneath the interconnect substrate 106. Molding compound 108 preferably includes a silica or inorganic-filled mold compound. Such a molding compound helps to reduce moisture absorption compared to an organic laminate.

Figure 1C:
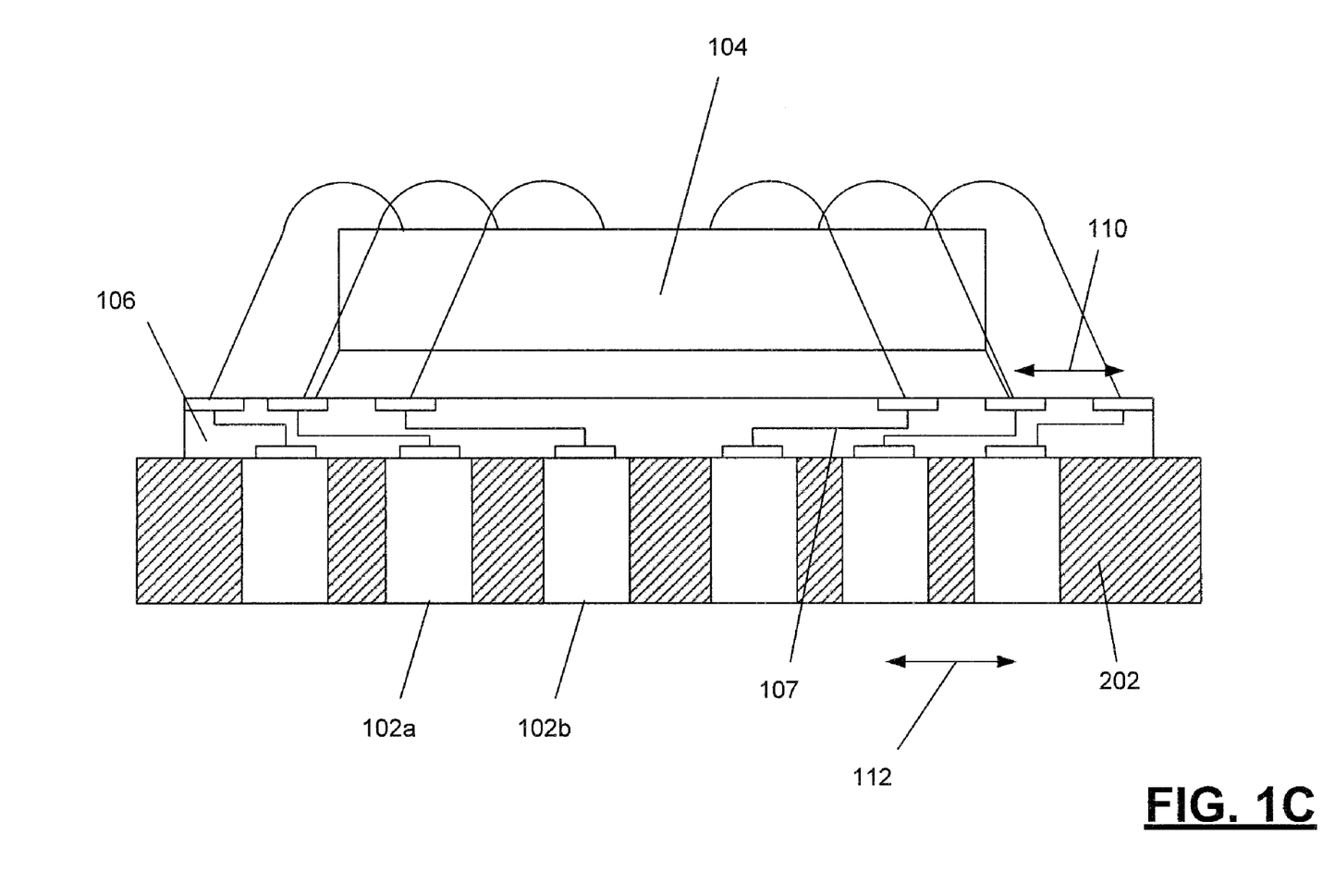
FIG. 1C is a close-up view of the embodiment of FIG. 1.

FIG. 1C shows an expanded view of the interconnect substrate 106. The contacts on the upper surface of substrate 106 have a fine pitch spacing 110. The contacts on the lower surface of substrate 106 have a larger pitch spacing 112. Substrate 106 allows fine pitch 110 to be expanded to larger pitch spacing 112. The process for forming package 100 with interconnect substrate 106 is outlined in FIG. 2A to FIG. 5B. The process begins with FIG. 2A.

Figure 2A:
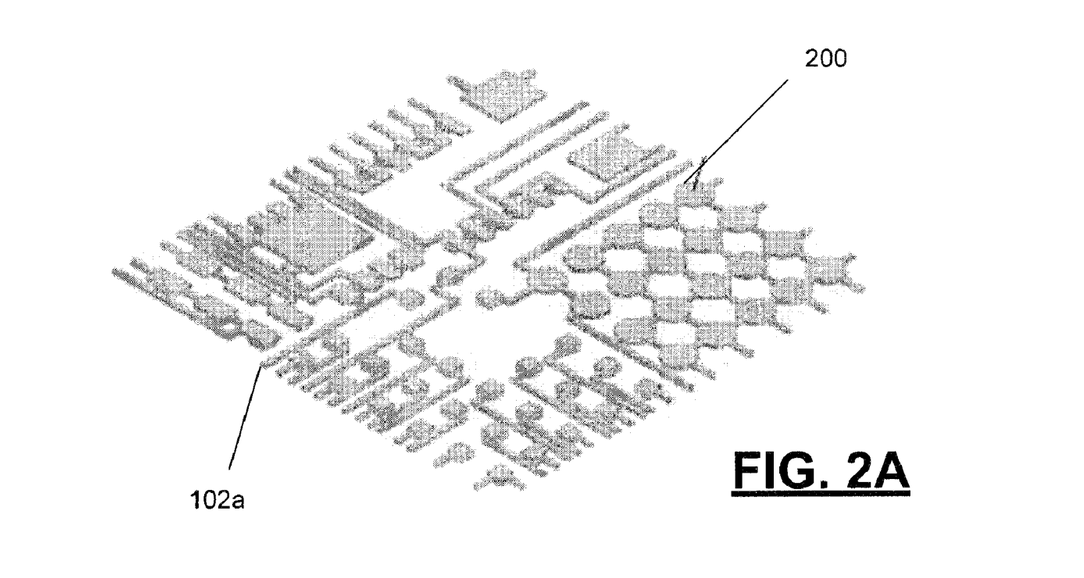
FIGS. 2A and 2B are perspective views of the frame before and after the molding compound is deposited.
Figure 2B:
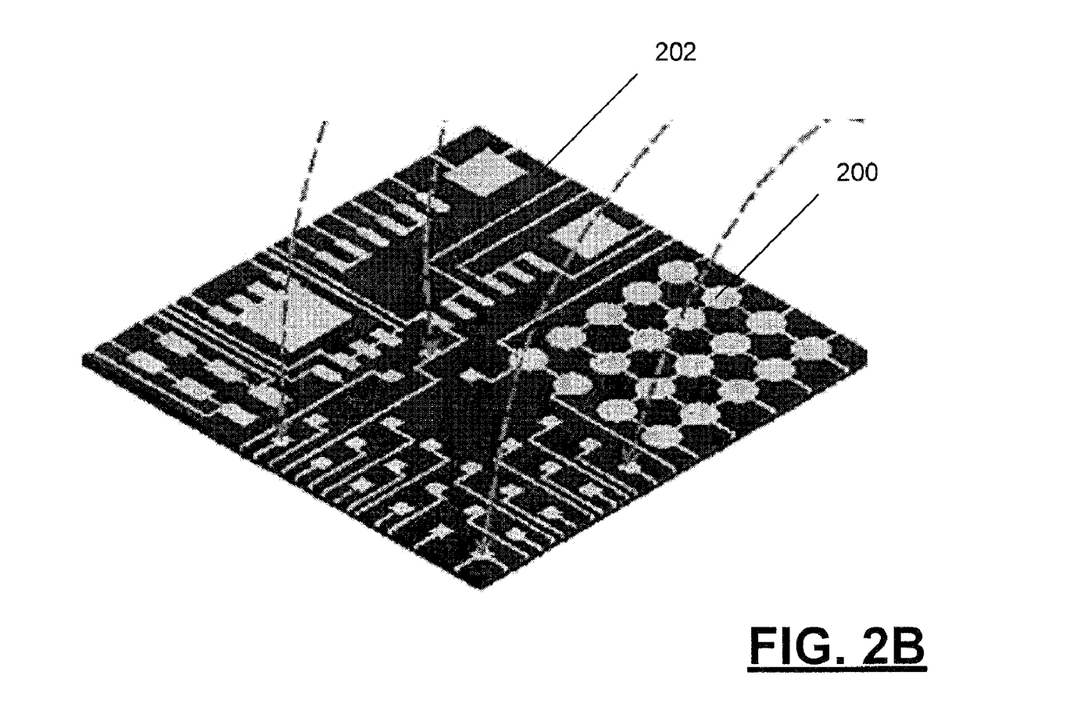

FIG. 2A shows pre-molded conductive trace frame 200 that includes a plurality of conductive traces such as trace 102a. As show in FIG. 2B, the frame 200 is partially encased in molding compound 202 such that at least the upper surface of the frame 200 remains exposed. In some embodiments, the lower surface of frame 200 remains exposed. In other embodiments, only a surface of the frame 200 is exposed on the lateral edges of the package.

Figure 3A:
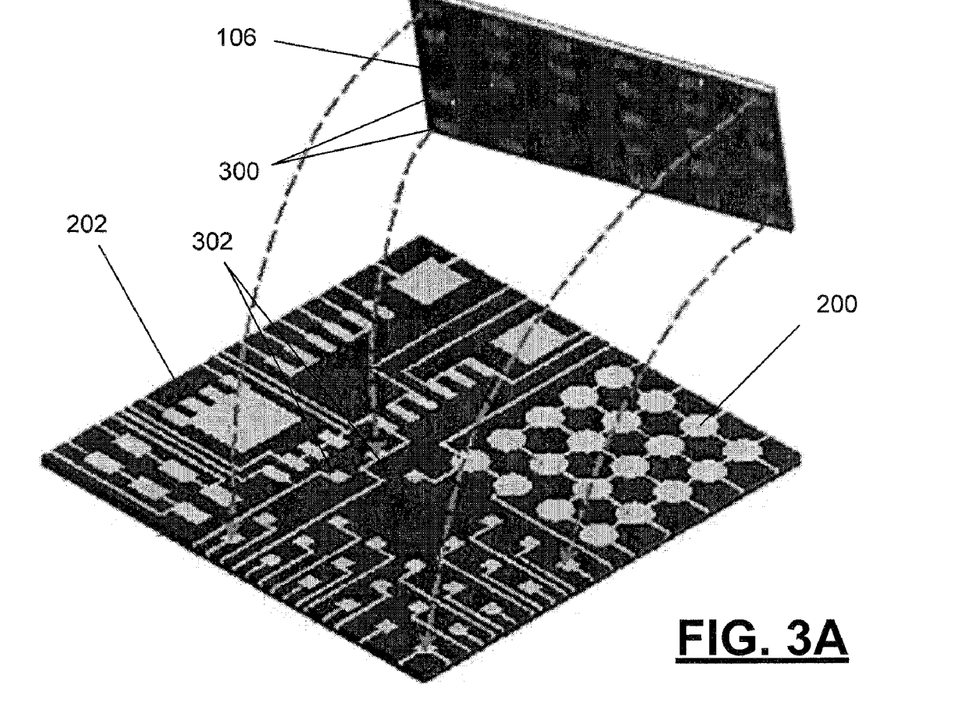
FIGS. 3A and 3B are perspective views of the molded frame before and after attachment of the interconnect substrate.
Figure 3B:
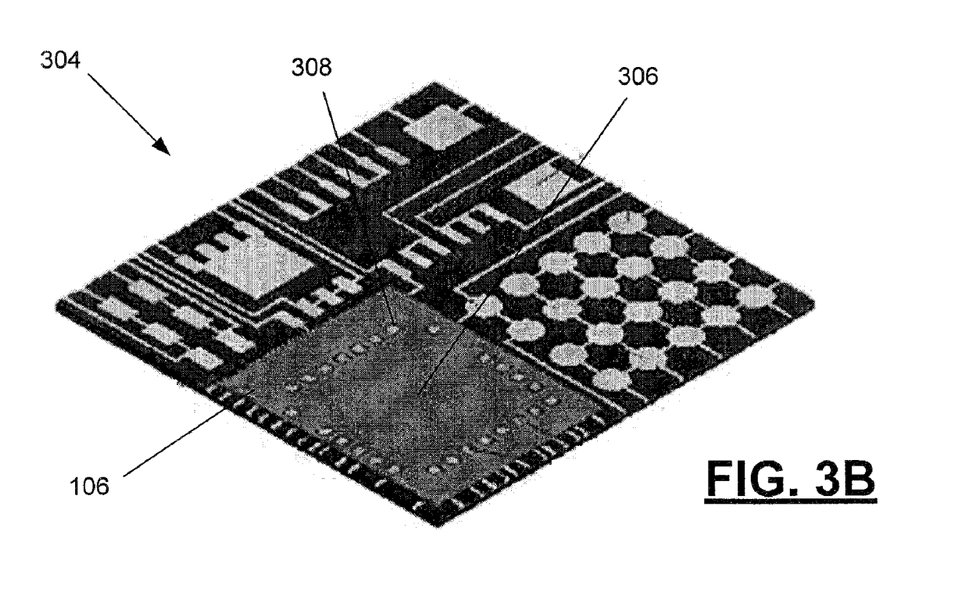

FIG. 3A shows substrate 106 being attached to conductive trace frame 200. As show in FIG. 3A, the lower surface of substrate 106 has a plurality of lower contacts 300. These lower contacts 300 are spaced to mate with corresponding trace contacts 302 on the top surface of the conductive trace frame 200. The lower contacts may be arranged into a regular pattern. For example, in FIG. 3A, the lower contacts are in a grid formation. Other suitable patterns would be apparent to one skilled in the art after benefiting from reading this specification. FIG. 3B shows substrate 106 after it has been mounted to frame 200. Upper contacts 308 are visible in FIG. 3B.

Upper contacts 308 are arranged in a ring about central region 306, which serves as the mounting region for integrated circuit 104 (see FIG. 1A). As discussed elsewhere in this specification, the fine spacing between the contacts on the upper surface is smaller than the spacing between the contacts on the lower surface of substrate 106. In assembly 304 depicted in FIG. 3B, such increased spacing is accommodated by having at least one of the lower contacts dispersed under the central region 306 on the lower surface, whereas the central region 306 is devoid of corresponding upper contacts on the upper surface.

Figure 4A:
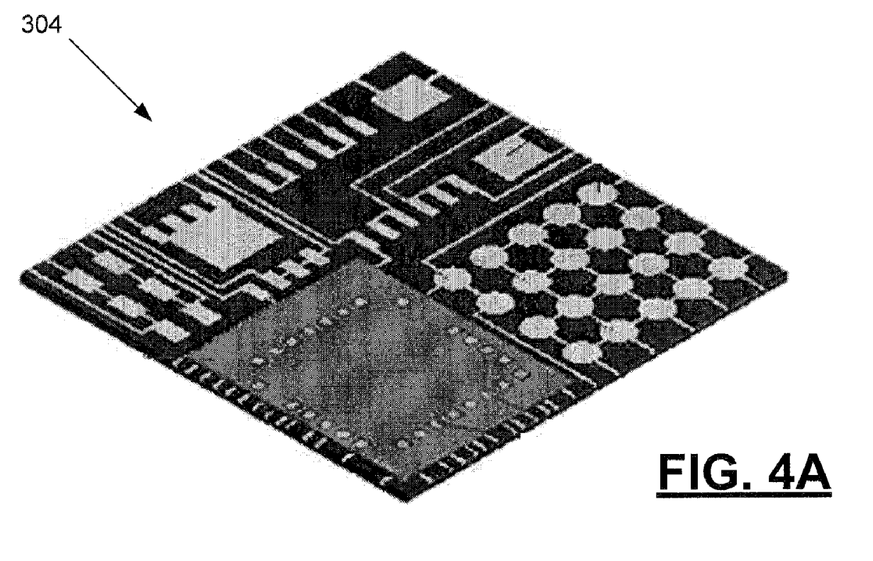
FIGS. 4A and 4B are perspective views of the top side and bottom side of one assembly of the invention.
Figure 4B:
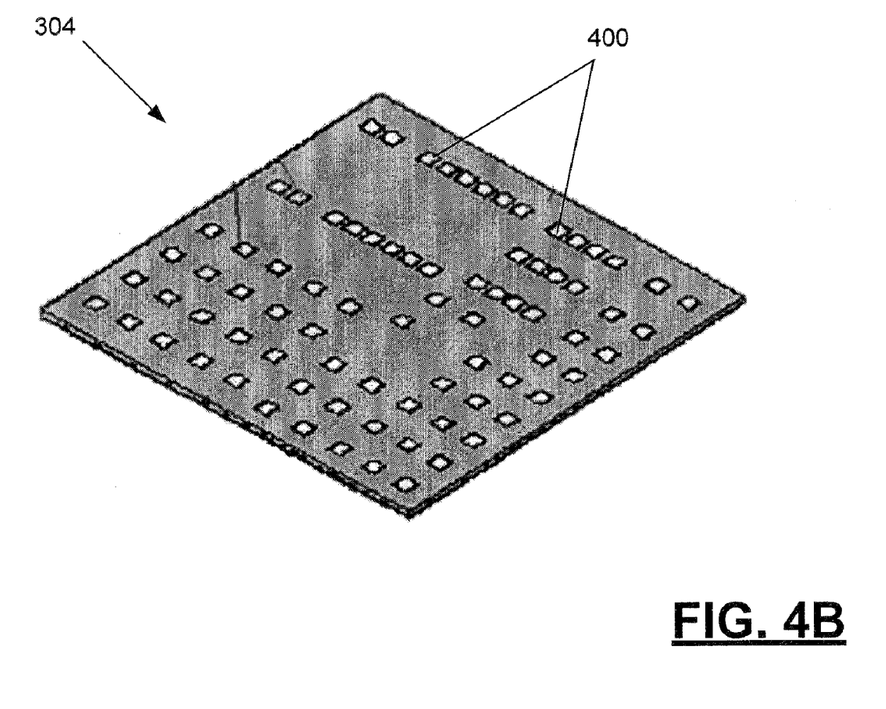

FIG. 4A and FIG. 4B show a top and bottom perspective view, respectively, of assembly 304. FIG. 4B shows the bottom surface of conductive frame 200 (see FIG. 2A) and depicts the exposed, bottom trace contacts 400.

Figure 5A:
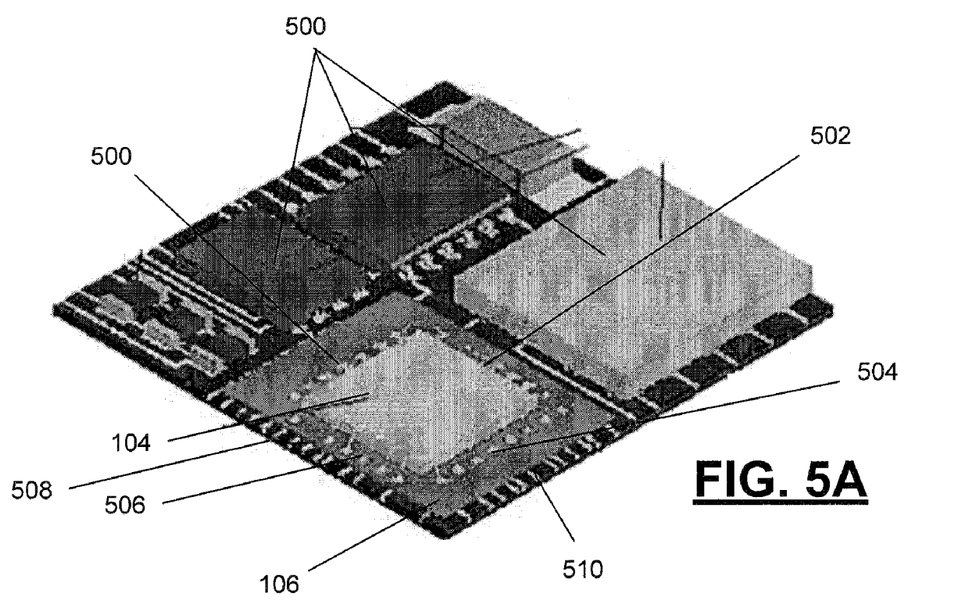
FIG. 5A is a perspective view of the assembly before encasing of the package within a molding compound and FIG. 5B is a view of another assembly of the invention that routes the leads to all four sides of the interconnect substrate.

FIG. 5A is a perspective view of assembly 304 after integrated circuit 104 has been wirebonded to the upper contacts such that electrical connections have been formed to the contacts on the upper surface of substrate 106. A plurality of other active and/or passive devices 500 have also been mounted to the frame 200. There is no limit on the number or types of devices. Such devices may include, but are not limited to, logic integrated circuits, DRAMS, SRAMS, programmable logic devices, flash memories, power devices such as diodes, MOSFETS, IGBTs, thyristors, capacitors, inductors and resistors. In FIG. 5A, the integrated circuit 104 is mounted in the corner of the package. The leads extend out of all four sides (500, 502, 504 and 506) of device 104 but, due to the space-saving configuration of interconnect substrate 106 and frame 200, the leads are routed to two adjacent sides (508 and 510). In FIG. 5A, such a configuration is obtained by running some of the leads under a portion of integrated circuit 104 (see the leads in FIG. 3A). This mounting configuration is substantially more compact than prior art mounting techniques and permits a higher density of devices to be mounted within a small package.

Figure 5B:
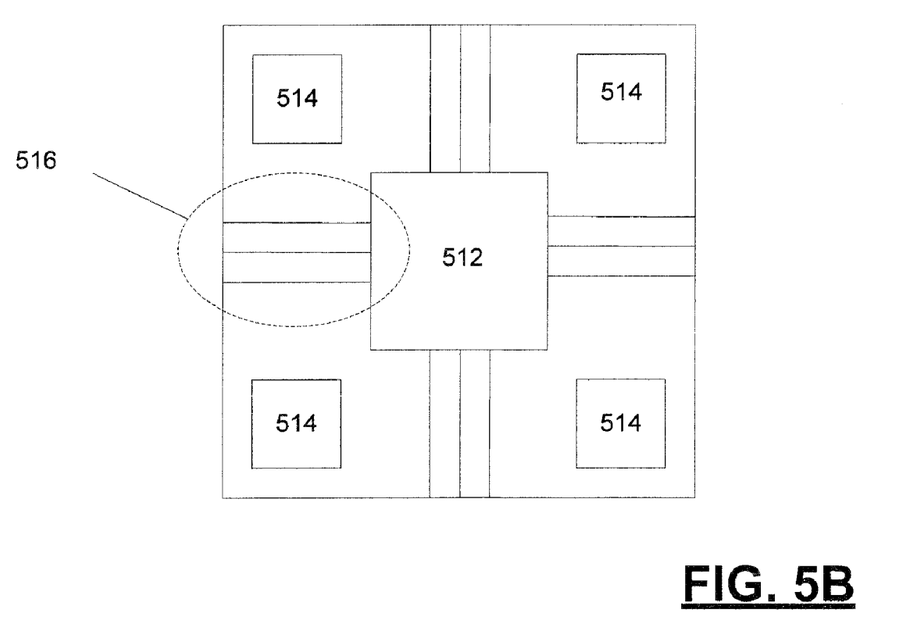

In contrast, FIG. 5B illustrates a more conventional approach. In FIG. 5B, the device 512 is connected to the external environment by leads 516. Other devices 514 are also present. Since the leads 516 extend in all four directions from device 512, a significant amount of surface area is lost to such leads and the resulting package cannot support as many devices. Nevertheless, the configuration of FIG. 5B is deemed within the scope of the claims and is one embodiment of the invention.

Figure 5C:
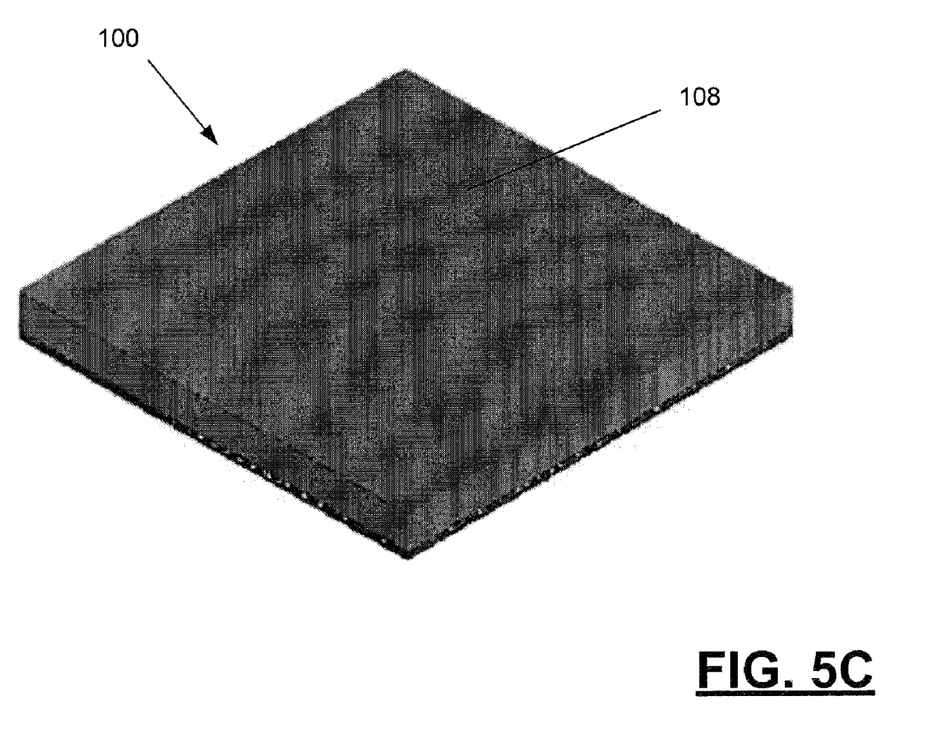
FIG. 5C is a perspective view of the assembly after the encasing of the package within a molding compound.

FIG. 5C shows the package 100 after the entire assembly of FIG. 5A has been encased in molding compound 108. Electrical contacts to frame 200 are available on the bottom and lateral surfaces of package 100.

Figure 6A:
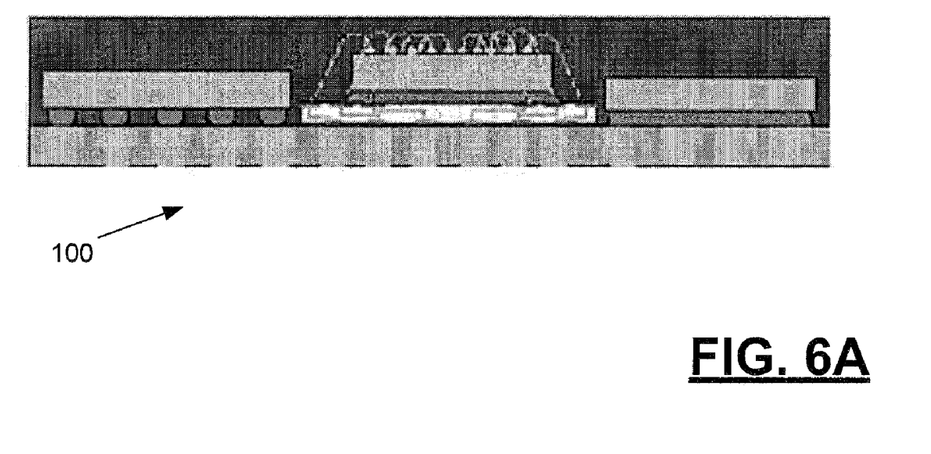
FIG. 6A is a perspective view of one embodiment of the invention with a flat bottom surface.
Figure 6B:
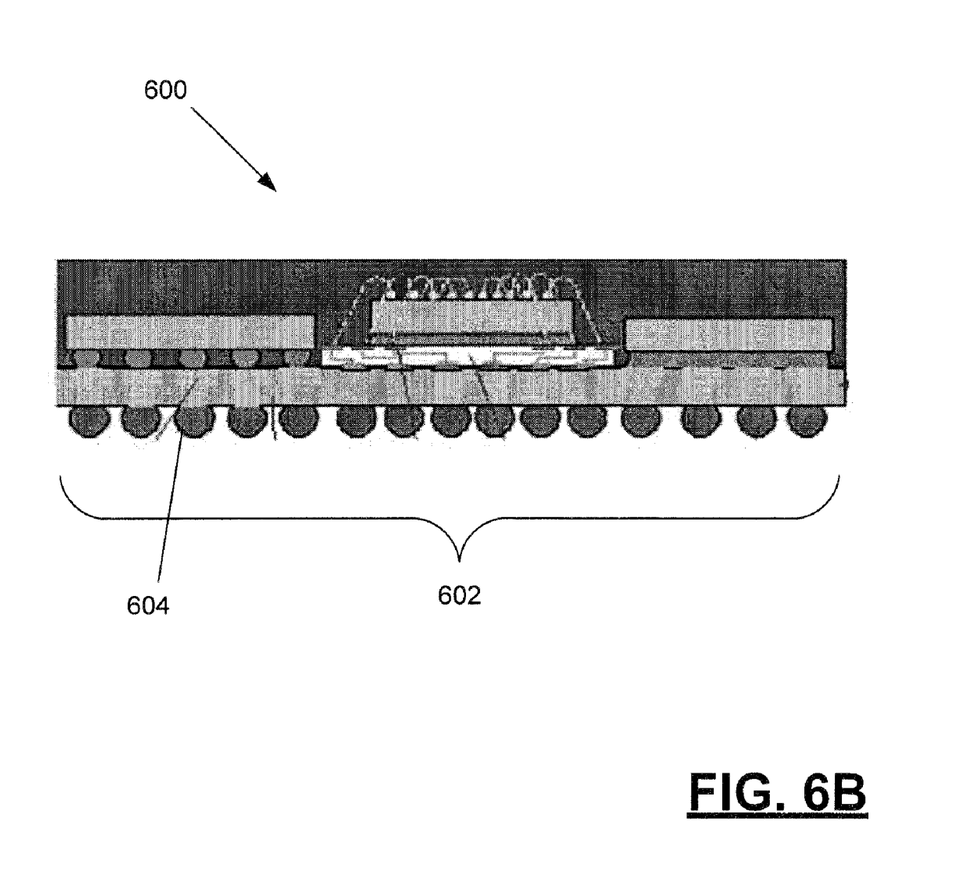
FIG. 6B is a perspective view of another embodiment of the invention with a ball grid array on the bottom surface.

In one embodiment, shown in FIG. 6A, the trace contacts on the bottom surface of package 100 remain exposed to the environment. In another embodiment, shown in FIG. 6B as package 600, a ball grid array (BGA) 602 is disposed on the bottom surface to facilitate the formation of electrical connections to the package 100. The ball grid array is comprised of a multiplicity of conductive balls 604.

Figure 6C:
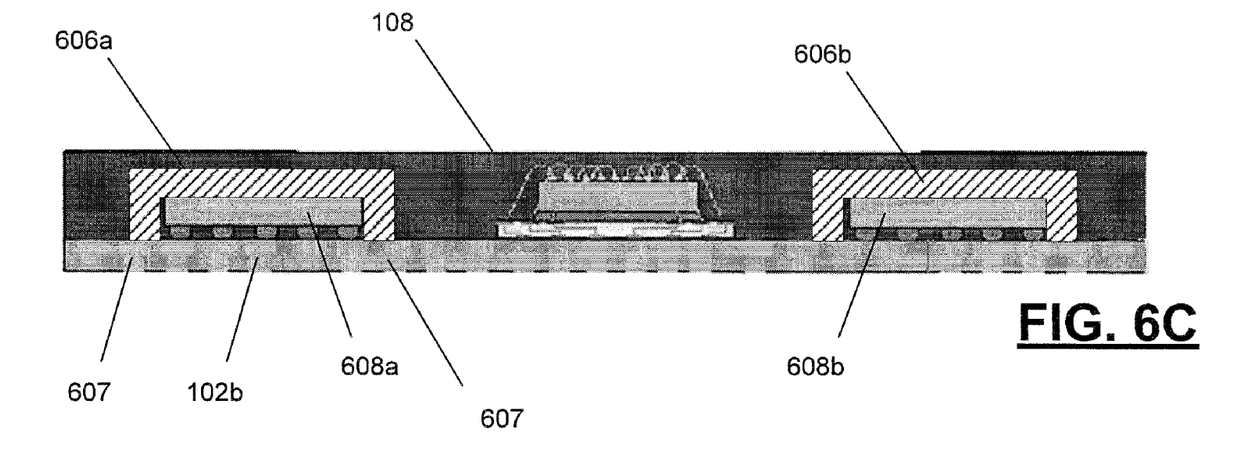
FIG. 6C and FIG. 6D are side views of two additional embodiments of the invention showing folded clips.

FIG. 6C is a side view of another embodiment of the invention. In the embodiment of FIG. 6C, folded clips 606a and 606b are folded about device 608a and 608b respectively. Clips 606a and 606b are electrically conductive and are disposed about the devices such that an electrical connection is made between the upper surface of the devices and the conductive traces, such as trace 607. In some embodiments, such as that shown in FIG. 6C, the upper surface of the clips 606a and 606b are enclosed within the molding compound 108. In other embodiments, such as that shown in FIG. 6D, the upper surface of the clips 610a and 610b are exposed to the environment outside molding compound 108. Such an embodiment is useful for efficiently dissipating heat away from the device. An example of such an embodiment is shown in FIG. 6E. In particular devices 608a, 608b could be power MOSFETS. Each is flip chip mounted so the drain faces up while the source and gate contacts are ball attached to the contacts within the interconnect substrate. Clips 606a and 606b are electronically and mechanically attached to the drains of the MOSFET. The clips have depending arms 618 that terminate in ball or flat contact connections to the trace.

Figure 6D:
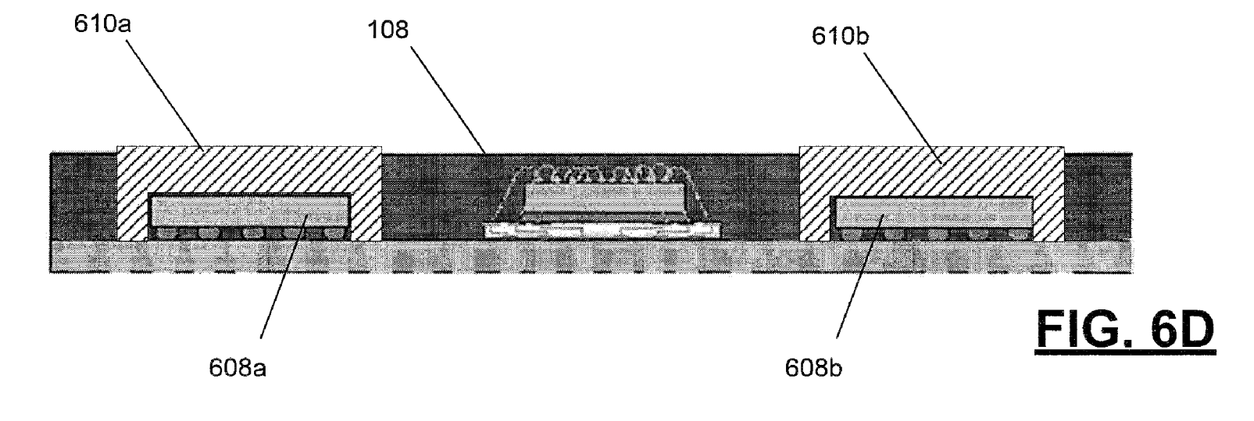
Figure 6E:
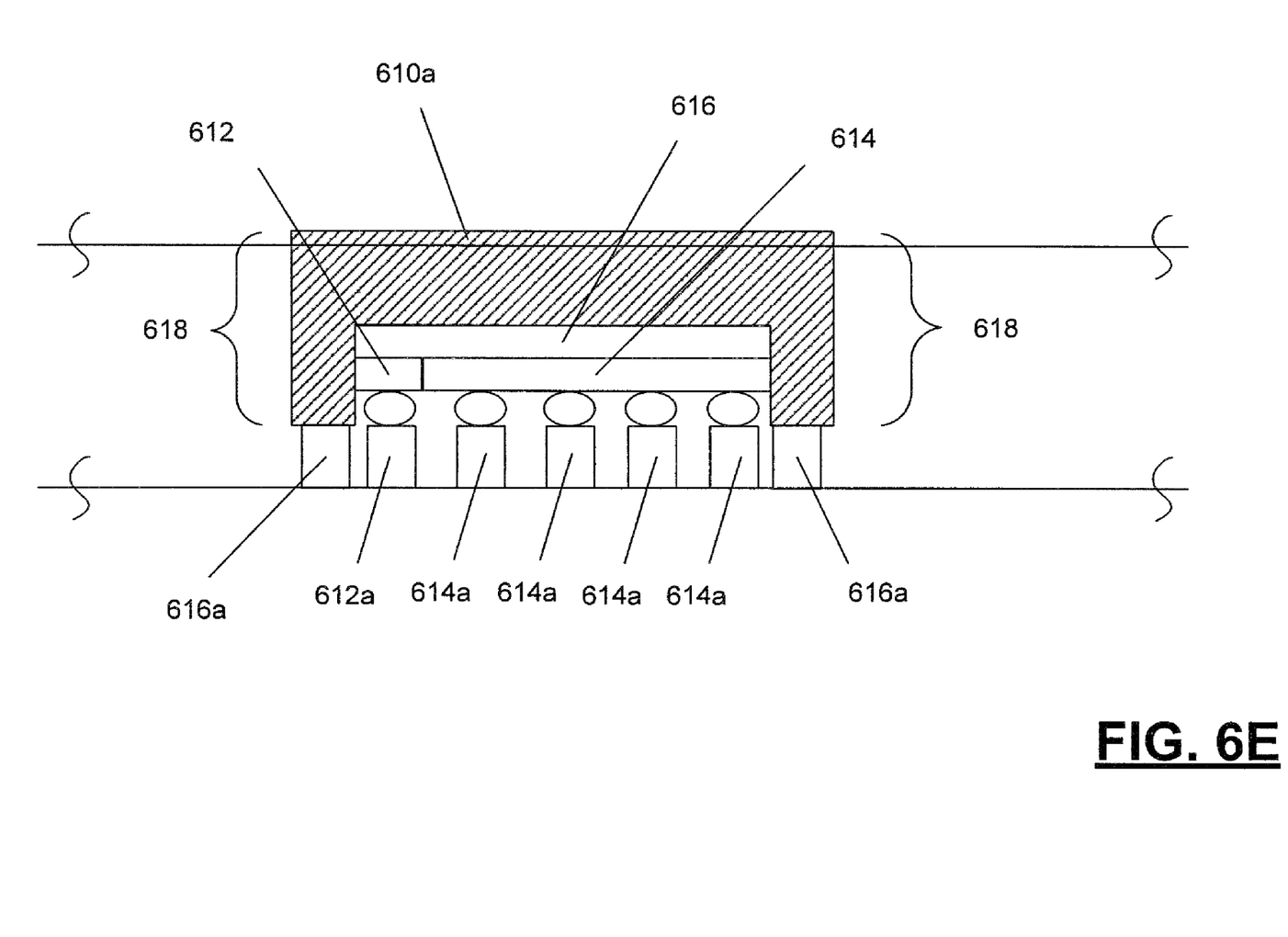
FIG. 6E is a close-up view of the folded clip of FIG. 6D attaching to a device.

FIG. 6E is a side view of one device of FIG. 6D. In the example shown in FIG. 6E, the device is a MOSFET with a gate 612 (connected to conductive trace 612a), a source 614 (connected to conductive traces 614a) and a drain 616. The drain 616 is connected to conductive traces 616a through folded clip 610a.

Figure 7A:
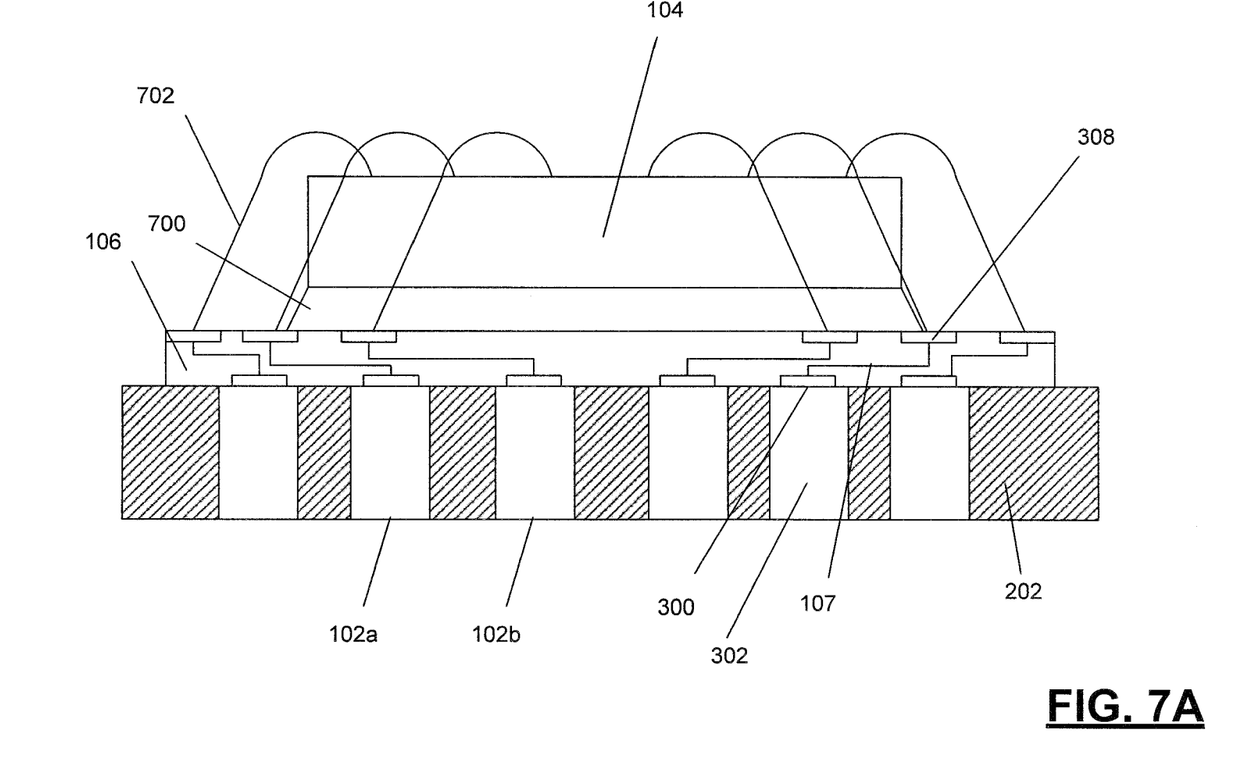
FIG. 7A is a side view similar to FIG. 2 which shows the upper and lower contacts.

FIG. 7A is a close-up view of the device 104 of FIG. 6A. Electrical connections between the device 104 and the upper contacts 308 are made with wires 702. Such wires may be connected by conventional wirebonding techniques. Interconnects 107 are clearly shown within substrate 106. Each interconnect forms an electrical connection between upper contact 308 and lower contact 300. This permits the pitch spacing of the lower contacts 300 to be larger than the pitch spacing of the upper contacts 308 (see FIG. 1C and the associated discussion). Device 104 is attached to substrate 106 with insulating adhesive 700.

Figure 7B:
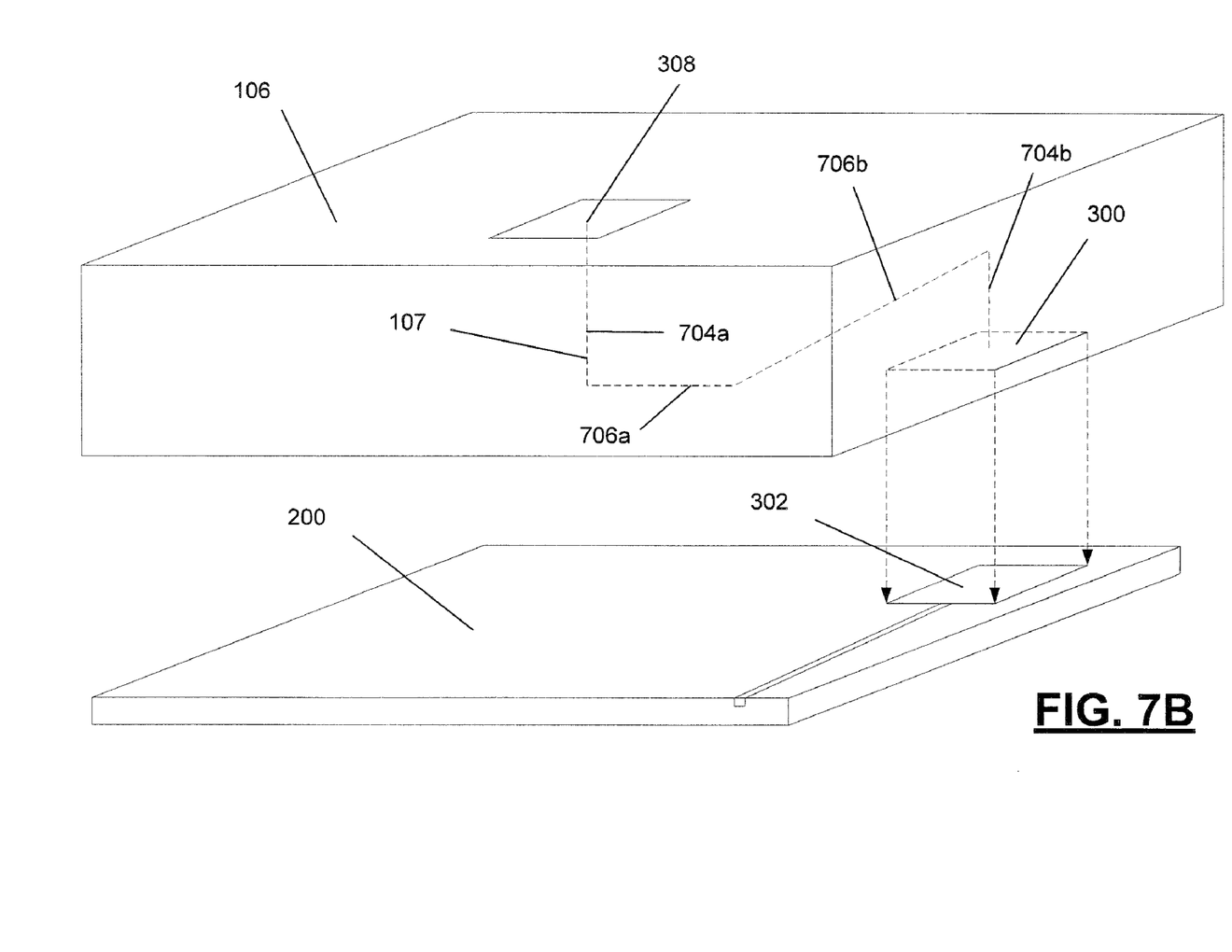
FIG. 7B is a perspective view of the interconnections of the interconnect substrate.

FIG. 7B is a perspective view of substrate 106 and trace 200 showing electrical interconnect 107 connecting upper contact 308 to lower contact 300. Lower contact 300 is disposed directly above trace contact 302 on trace 200. For clarity of illustration, a single pair of contacts is shown, although it is clear that multiple contacts are commonly present. Electrical interconnect 107 moves along both vertical direction 704a and 704b and along horizontal direction 706a and 706b. In the embodiment depicted, there are two horizontal sections 706a and 706b which allow the upper contact 308 to be non-aligned with respect to lower contact 300. These two sections 706a and 706b are orientated at relatively sharp angles to one another. In FIG. 7B, the angle is approximately ninety degrees. In another embodiment, a single horizontal section, rather than two horizontal sections, is used to allow the upper and lower contacts 308 and 300 to be non-aligned.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A packaged system for integrated circuits, semiconductor devices and passive components comprising:
a molding compound encasing:
an interconnect substrate with
an upper surface that has a plurality of upper contacts arranged in a ring about a central region;
a lower surface that has a plurality of lower contacts dispersed within a region bound by the ring;
a plurality of interconnects, each of the interconnects connecting one of the upper contacts to one of the lower contacts, the interconnects being embedded in an insulator for electrically isolating the interconnects from one another;
at least one integrated circuit mounted on the central region of the upper surface and electrically connected to the plurality of upper contacts;
a molded trace frame with a bottom surface and a top surface, and having a plurality of traces encased in the molding compound such that a surface of one of the traces is exposed outside of the molding compound and the top surface includes a plurality of trace contacts that are in electrical communication with the plurality of lower contacts.

2. The package of systems as recited in claim 1, wherein the lower contacts are arranged in a grid.

3. The package of systems as recited in claim 1, further comprising a ball grid array electrically connected to the bottom surface of one of the traces.

4. A packaged system for integrated circuits, semiconductor devices and passive components comprising:
a molding compound encasing:
an interconnect substrate with
an upper surface that has a plurality of upper contacts arranged in a ring about a central region;
a lower surface that has a plurality of lower contacts dispersed within a region bound by the ring;
a plurality of interconnects, each of the interconnects connecting one of the upper contacts to one of the lower contacts, the interconnects being embedded in an insulator for electrically isolating the interconnects from one another;
at least one integrated circuit mounted on the central region of the upper surface and electrically connected to the plurality of upper contacts wherein the integrated circuit is electrically connected to the plurality of upper contacts by wirebonds;
a molded trace frame with a bottom surface and a top surface, and having a plurality of traces encased in the molding compound such that a surface of one of the traces is exposed outside of the molding compound and the top surface includes a plurality of trace contacts that are in electrical communication with the plurality of lower contacts.

5. The package of systems as recited in claim 1, further comprising a second integrated circuit which contacts the top surface of one of the conductive traces thus forming an electrical contact between the second integrated circuit and one of the traces.

6. The package of systems as recited in claim 1, wherein the plurality of traces includes a plurality of leads configured such that those leads that connect to the integrated circuit extend to either a first edge or a second edge of the molding compound, wherein the first edge and second edge are adjacent to one another.

7. The package of systems as recited in claim 6, wherein at least one of the leads that connects to the integrated circuit runs under the integrated circuit.

8. The package of systems as recited in claim 1, wherein the integrated circuit is mounted in a corner.

9. The package of systems as recited in claim 1, the plurality of traces is encased within the molding compound such that a lateral surface of one of the traces is exposed on the side of the molding compound.

10. The package of systems as recited in claim 1, wherein the at least one integrated circuit includes at least three integrated circuits.

11. The package of systems as recited in claim 1, further comprising one or more devices selected from the group consisting of logic integrated circuits, DRAMS, SRAMS, programmable logic devices, flash memory devices, diodes, MOSFETS, IGBTs, and thyristors, capacitors, inductors and resistors.

12. A packaged system for integrated circuits, semiconductor devices and passive components comprising:
a molding compound encasing:
a interconnect substrate with
an upper surface that has a plurality of upper contacts arranged in a ring about a central region;
a lower surface that has a plurality of lower contacts dispersed within a region bound by the ring;
a plurality of interconnects, each of the interconnects connecting one of the upper contacts to one of the lower contacts, the interconnects being embedded in an insulator for electrically isolating the interconnects from one another;
a plurality of integrated circuits including a first integrated circuit mounted on the central region of the upper surface and electrically connected to the plurality of upper contacts and a second integrated circuit wherein the first and second integrated circuits are independently selected from the group consisting of a logic integrated circuit, a DRAM device, a SRAM device, a programmable logic device, a flash memory device, diodes, a MOSFET, a IGBT, a thyristor, a capacitor, an inductor and a resistor;
a molded trace frame with a bottom surface and a top surface, and having a plurality of traces being encased such that the bottom surface is exposed outside of the molding compound and the top surface includes a plurality of trace contacts that are in electrical communication with the plurality of lower contacts, the MOSFET being electrically connected to the trace frame such that the gate, the source, and the drain are all electrically connected to the bottom surface.

* * * * *